(12) United States Patent
Tsironis (10) Patent No.: US 9,716,303 B1
(45) Date of Patent: Jul. 25, 2017

(54) LOW COST PROBES FOR SLIDE SCREW TUNERS

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 14/752,200

(22) Filed: Jun. 26, 2015

Related U.S. Application Data (60) Provisional application No. 62/017,936, filed on Jun. 27, 2014.

(51) Int. Cl.
  *H03H 7/38* (2006.01)
  *H01P 5/04* (2006.01)
  *H03H 7/40* (2006.01)

(52) U.S. Cl.
  CPC .................. *H01P 5/04* (2013.01); *H03H 7/40* (2013.01)

(58) Field of Classification Search
  CPC .................................. H03H 7/38; H03H 7/40
  USPC .................................... 333/263, 17.3, 32, 33
  See application file for complete search history.

(56) References Cited

U.S. PATENT DOCUMENTS

| | | |
|---|---|---|
| 7,248,866 B1 | 7/2007 | Tsironis |
| 8,410,862 B1 | 4/2013 | Tsironis |
| 8,461,946 B1 * | 6/2013 | Tsironis .................. G01R 1/26 333/17.3 |

* cited by examiner

*Primary Examiner* — Stephen E Jones (57) ABSTRACT

A new tuning probe for slide-screw impedance tuners uses a simplified semi-cylindrical tubular form. This ensures reduced manufacturing cost and high machining tolerance for probes using galvanic ground contact. RF performance matches or exceeds traditional cubical probes both using galvanic and capacitive ground contacts.

3 Claims, 15 Drawing Sheets

LOW COST PROBES FOR SLIDE SCREW TUNERS

PRIORITY CLAIM

This application claims priority on provisional application 62/017,936 named "Low Cost Probes for Slide Screw Tuners", filed on Jun. 27, 2014.

CROSS-REFERENCE TO RELATED ARTICLES

1. Load Pull Measurements, http://en.wikipedia.org/wiki/Load_pull.
2. "Computer Controlled Microwave Tuner—CCMT", Product Note 41, Focus Microwaves, January 1998.
3. Standing wave ratio, VSWR, https://en.wikipedia.org/wiki/Standing_wave_ratio.
4. Corona discharge, http://en.wikipedia.org/wiki/Corona_discharge.
5. "High Resolution Tuners Eliminate Load Pull Performance Errors", Application Note 15, Focus Microwaves, January 1995.
6. HFSS, High frequency electro-magnetic simulator, http://en.wikipedia.org/wiki/HFSS.
7. TSIRONIS, U.S. Pat. No. 7,248,866, "Frequency selective load pull tuner and method".
8. Anodization, http://en.wikipedia.org/wiki/Anodizing.
9. TSIRONIS, U.S. Pat. No. 8,410,862, "Compact Multi Frequency-Range Impedance Tuner", FIGS. 2b) and 17.

BACKGROUND OF THE INVENTION

This invention relates to RF load and source pull testing of medium and high power RF transistors and amplifiers using remotely controlled electro-mechanical impedance tuners.

Modern design of high power and low noise RF amplifiers and mixers, used in various communication systems, requires accurate knowledge of the active device's (microwave transistor's) characteristics. In such circuits, it is insufficient for the transistors, which operate in their highly non-linear regime, close to power saturation, to be described using non-linear numeric models.

Figure 1:
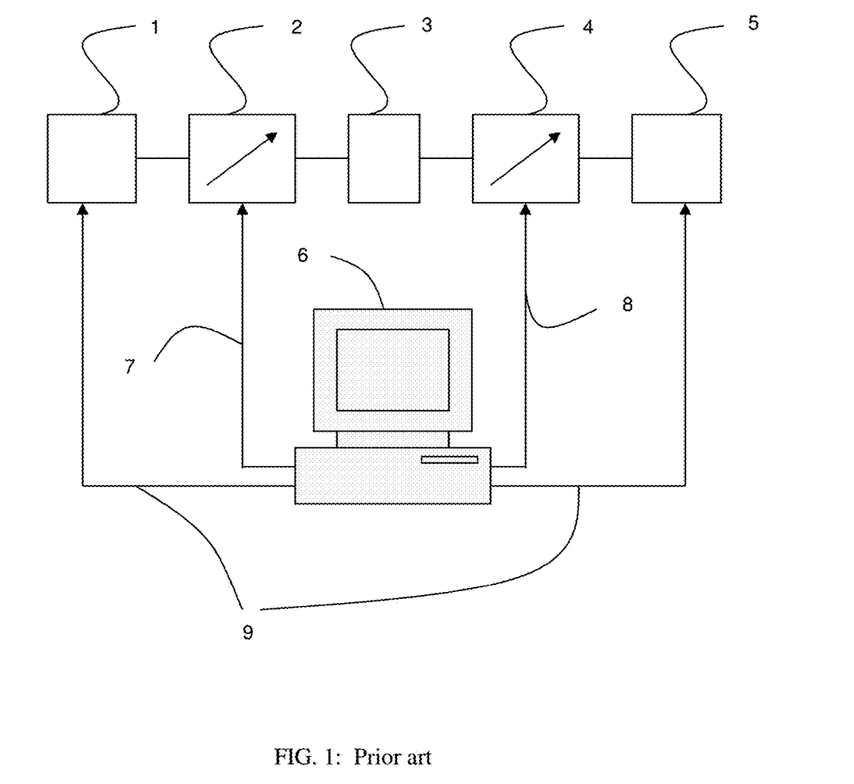
FIG. 1 depicts prior art, a typical automated transistor load pull test system.

A popular method for testing and characterizing such microwave components (transistors) is "load pull" or "source pull". Load/Source pull is a measurement technique employing microwave tuners and other microwave test equipment (FIG. 1), such as signal source (1), input and output tuner (2, 4), power meter (5) and test fixture (3) which comprises the device under test (DUT). The tuners and equipment are controlled by a computer (6) via digital cables (7, 8, 9). The microwave impedance tuners are used in order to manipulate the microwave impedance conditions under which the DUT (transistor) is tested (see ref. 1); this document refers hence to "impedance tuners", in order to make a clear distinction to "tuned receivers (radios)", popularly called elsewhere also "tuners" because of the included tuning circuits (see ref. 2).

Figure 2:
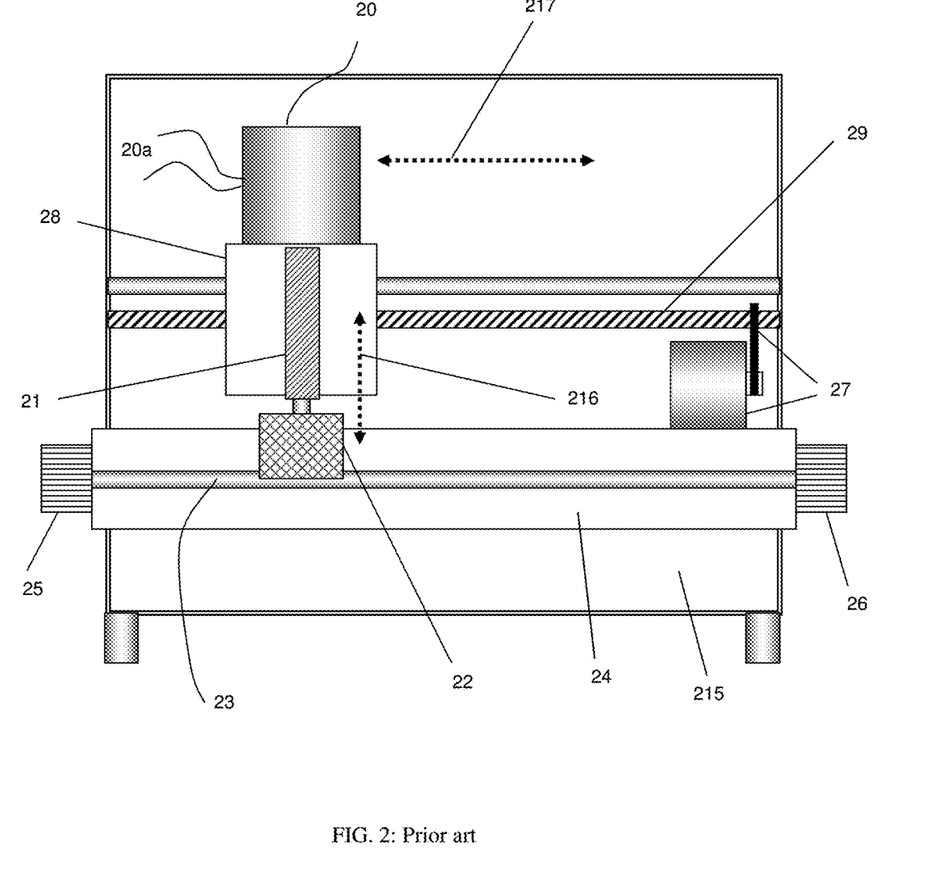
FIG. 2 depicts prior art, a frontal cross section of an automated slide screw impedance tuner using a single vertical axis and RF probe (slug).

Electro-mechanical impedance tuners (FIG. 2) in the frequency range between 100 MHz and 60 GHz use the slide-screw concept and include a slabline (24) with a center conductor (23) and one or more mobile carriages (28) which carry a motor (20), a vertical axis (21) and control the vertical position (216) of a reflective probe (22). The carriages are moved horizontally (217) by additional motors and gear (27). The signal enters into one port (25), the "test port", and exits from the other port (26), the "idle port"; in the case of the input tuner (2) the test port is the signal exit port, whereas in the case of the output tuner the test port is the signal entry port. The entire tuner mechanism is, typically, integrated in a solid housing (215) since mechanical precision is of highest priority.

Figure 3:
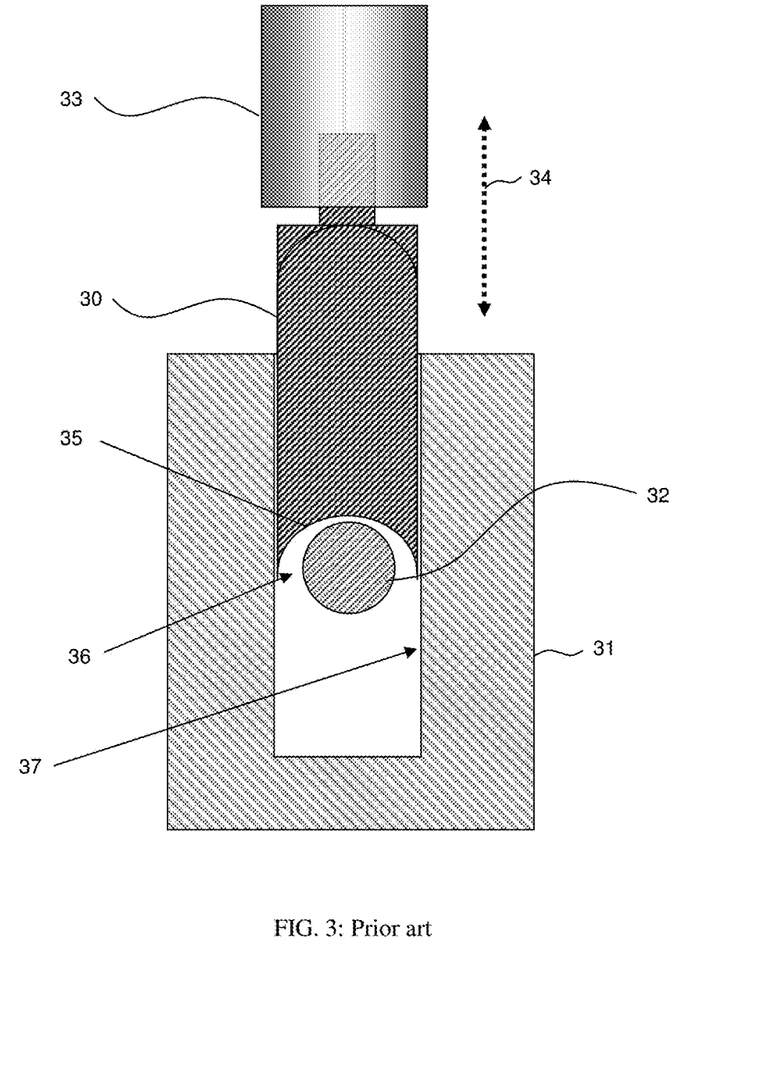
FIG. 3 depicts prior art, cross section of RF tuning probe inside a slotted airline (slabline) approaching the center conductor.
Figure 4:
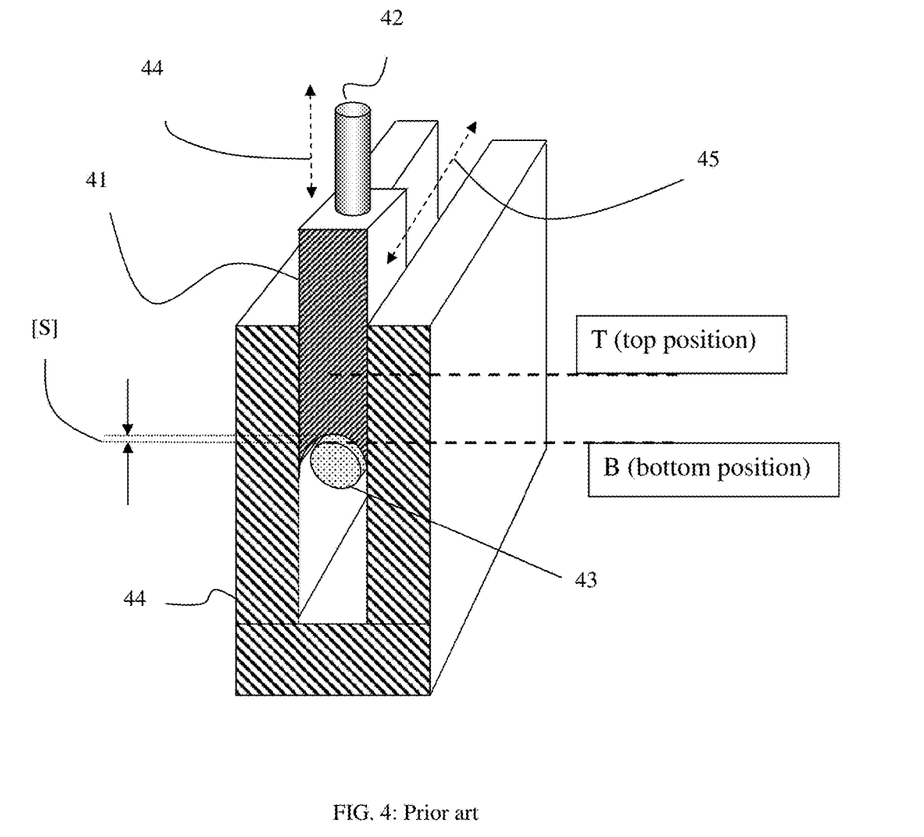
FIG. 4 depicts prior art, a perspective view of relevant dimensions and parameters of the operation of a vertically adjustable RF tuning probe (slug).

The typical configuration of the core of the tuner is shown in FIGS. 3 and 4; it comprises, in general, a slotted transmission airline (31, 44) and a number of metallic parallel tuning elements (30, 41) also called "tuning" probes, "reflective" probes or "slugs", which are coupled with the center conductor to an adjustable degree, depending from very low coupling (when the probe is withdrawn) to very strong coupling (when the probe is within Corona discharge distance from the center conductor, see ref. 4). "Sampling" probes on the other hand are loosely coupled with the center conductor and only detect a small amount of the signal power.

When the tuning probes approach (34, 44) the center conductor (32, 43) of the slabline (31, 44) and moved along the axis (45) of the slabline, they modify the amplitude and phase of the reflection factors, covering parts or the totality of the Smith chart (the normalized reflection factor area). The relation between reflection factor and impedance is given by GAMMA=(Z−Zo)/(Z+Zo), where Z is the complex impedance Z=R+jX and Zo is the characteristic impedance. A typical value used for Zo is 50 Ohms (see ref. 3).

Figures 13A, 13B:
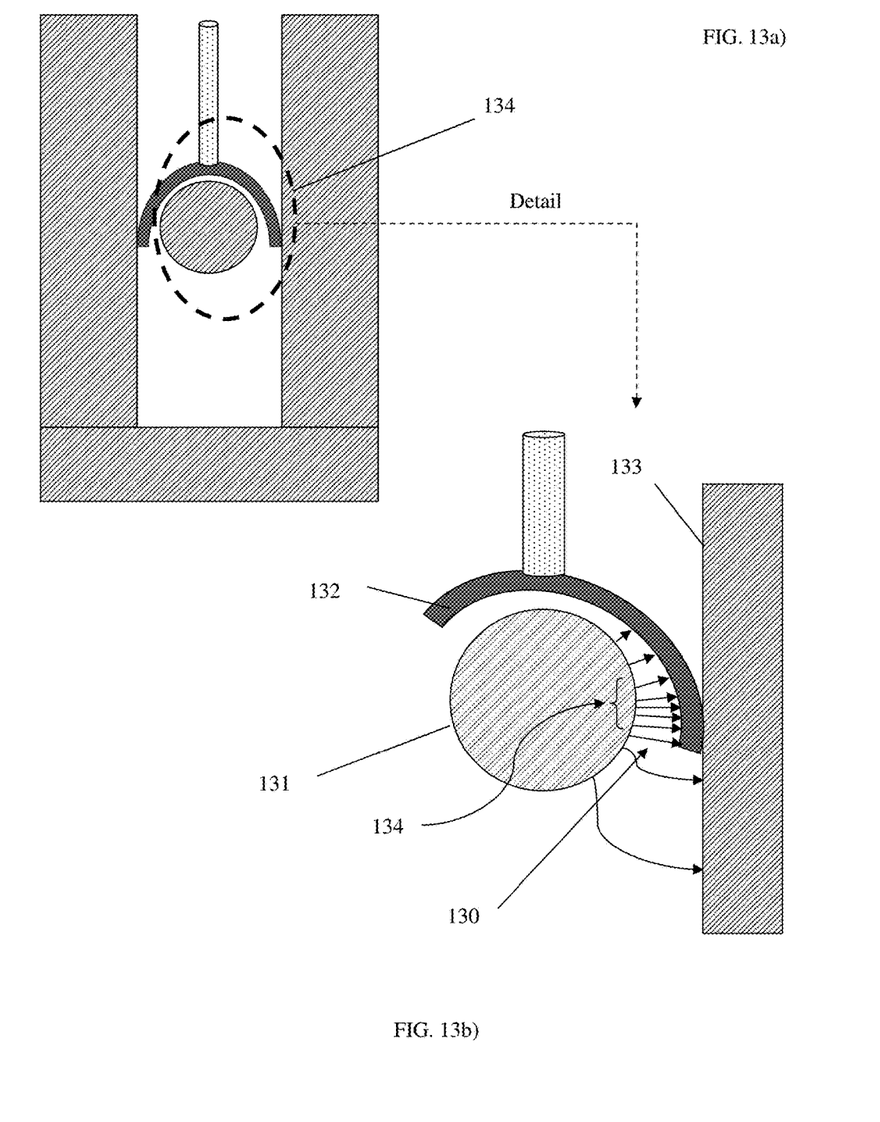

Up to now such tuning metallic probes (slugs) have been made in a cubical form (30, 41) with a concave bottom (35) which allows capturing, when approaching the center conductor (32, 43), the electric field which is concentrated in the area (36) between the center conductor (32) and the ground planes of the slabline (31) (FIGS. 3 and 13), where the center conductor is closest to the internal surface of sidewalls (37). This field capturing allows creating high and controllable reflection factors. Contact of the probes with the sidewalls (37) is critical. It can be either capacitive or galvanic. If the contact is capacitive, the surface of the probes and/or the sidewalls of the slabline must be electrically insulated. This can be done using chemical process such as "anodization" (see ref. 8). Nevertheless capacitive contact means extreme requirement in sidewall planarity and straightness to keep the quasi sliding contact constant for the whole length and depth of the slabline as the probe travels.

Figure 5:
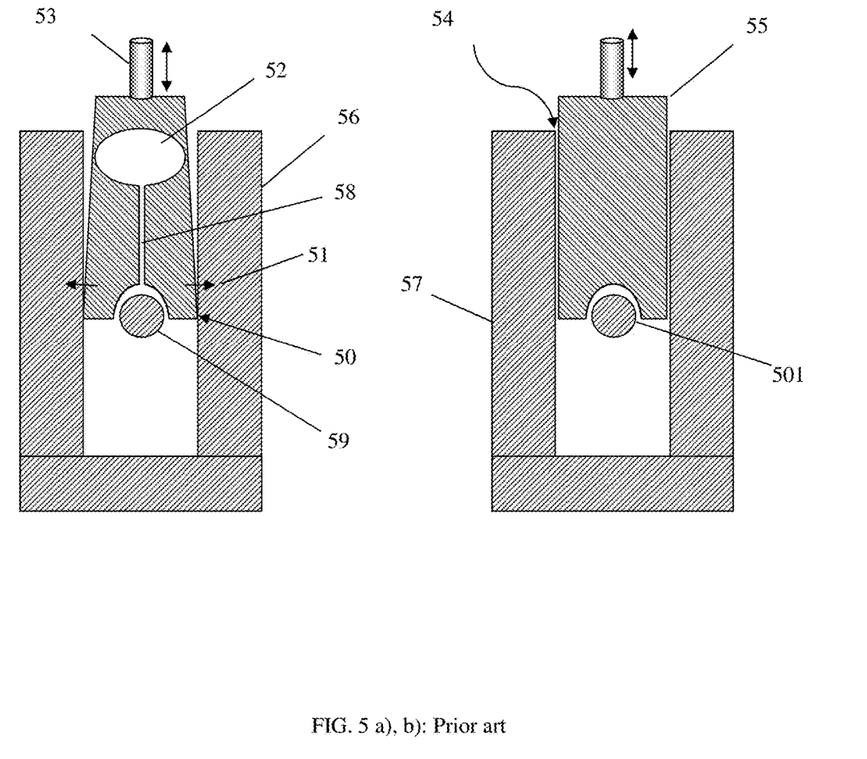
FIG. 5 depicts prior art: front views of cubical tuning probes with galvanic ground contact (5a) and capacitive ground contact (5b).

Galvanic contact is safer, but requires a spring mechanism to allow for constant pressure of the probe on the sidewalls. The two possible scenarios (capacitive and galvanic contact) are shown in FIG. 5; FIG. 5a) shows a probe (56) with galvanic ground contact (50) and FIG. 5b) a probe (55) with capacitive contact (54) with the slabline walls (56, 57). Probe 5a) must have a springing mechanism (51) which is created by machining a horizontal hole and slot (52) into the body of the probe. Probe 5b) can be massive (55).

BRIEF DESCRIPTION OF THE SEVERAL VIEWS OF THE DRAWINGS

The invention and its mode of operation will be more clearly understood from the following detailed description when read with the appended drawings in which:

FIG. 11a) through 11b): 11a) depicts perspective view of new probe for higher frequencies (Fmax=50 GHz); 11b) depicts the frequency response of the reflection factor of the high frequency probe at maximum coupling (closest to center conductor).

FIG. 13a) through 13b): 13a) depicts the electric field distribution in a slabline in the area of the tuning probe having galvanic ground contact, when the tuning probe approaches the center conductor; 13b) depicts a detail in the area of the ground contact.

DETAILED DESCRIPTION OF THE INVENTION

Figure 6:
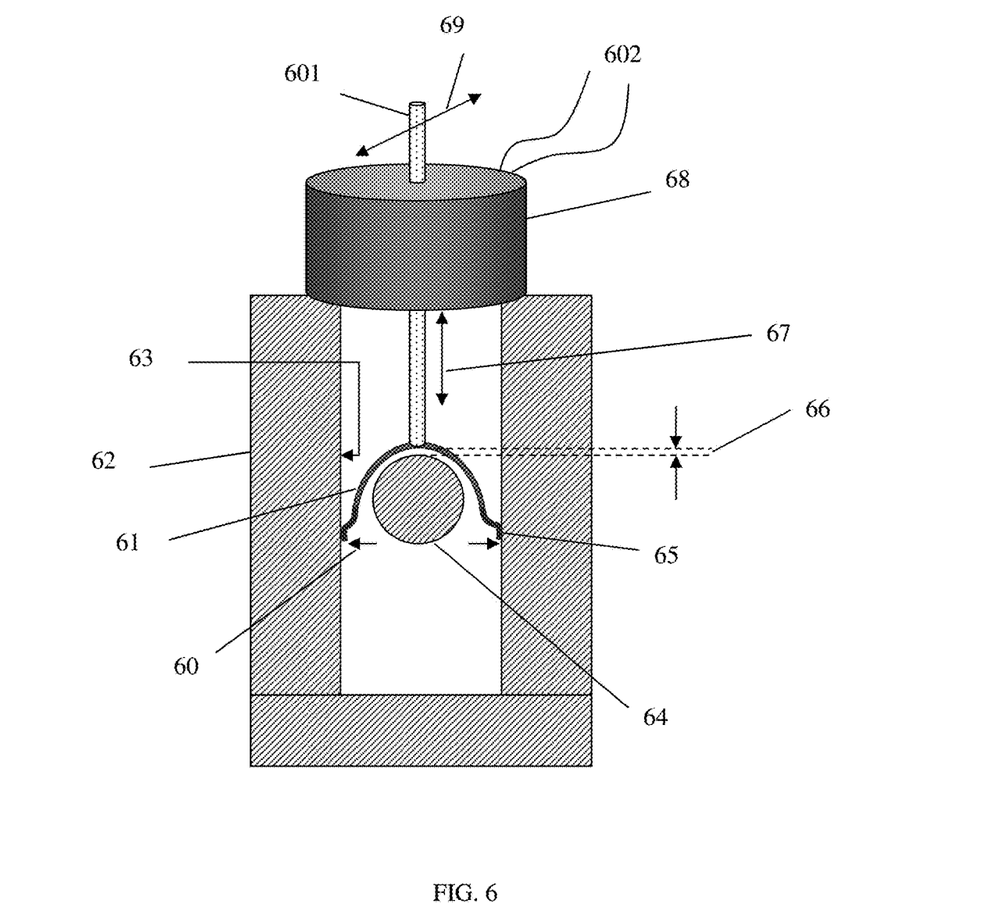
FIG. 6 depicts a cross section of the new tubular tuning probe and the control mechanism for vertical movement inside the slabline.
Figure 7:
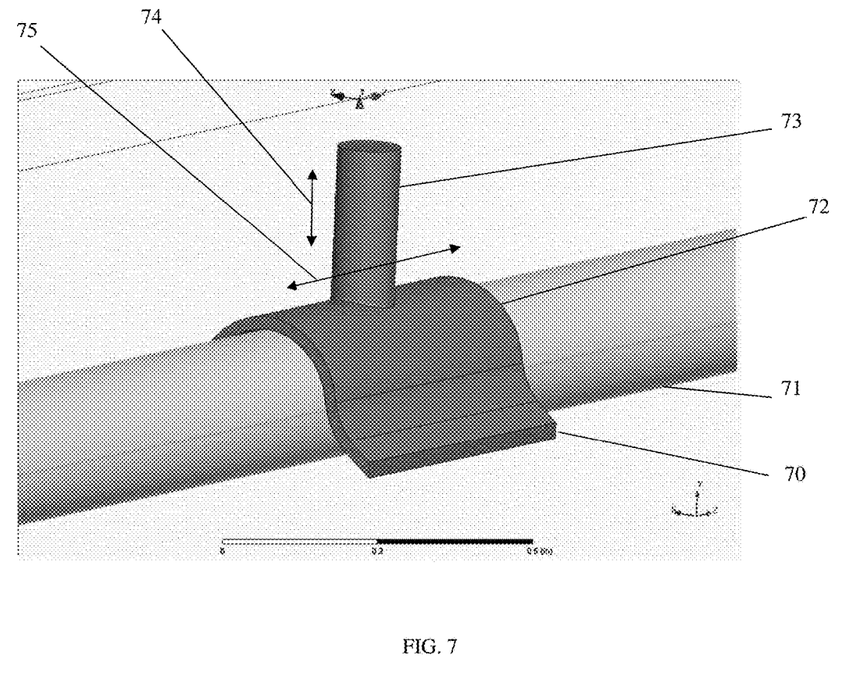
FIG. 7 depicts a perspective view of the new tuning probe placed for maximum coupling and reflection factor close to the center conductor.
Figure 9:
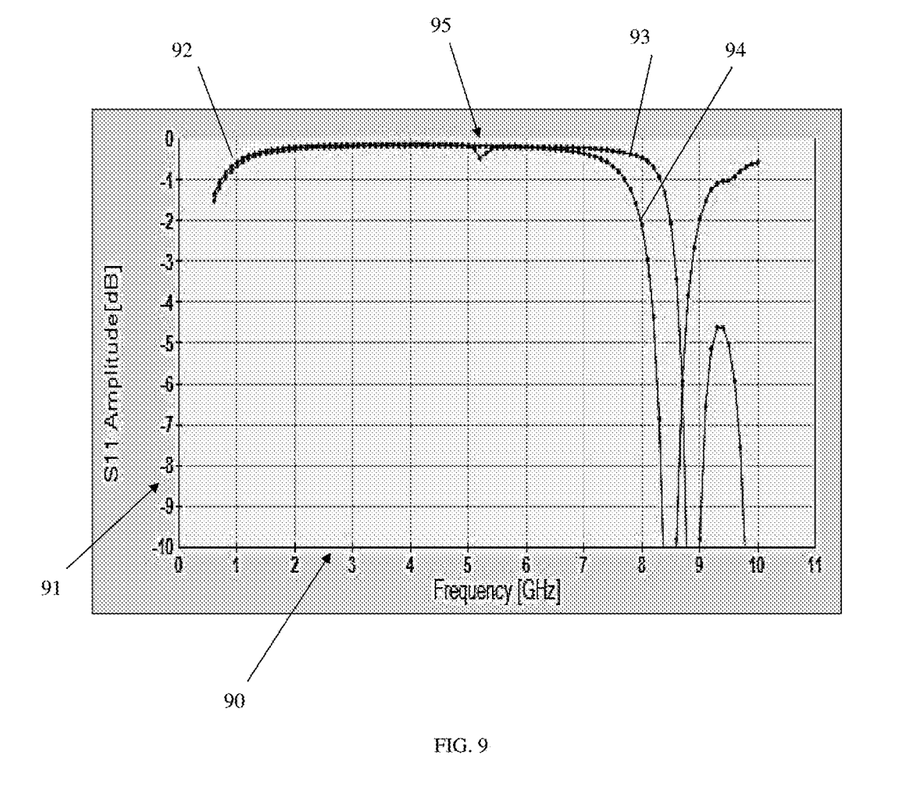
FIG. 9 depicts a comparison of wideband reflection factor (S11) between a prior art probe (FIG. 5a) and the new probe (FIG. 6).
Figures 11A, 11B:
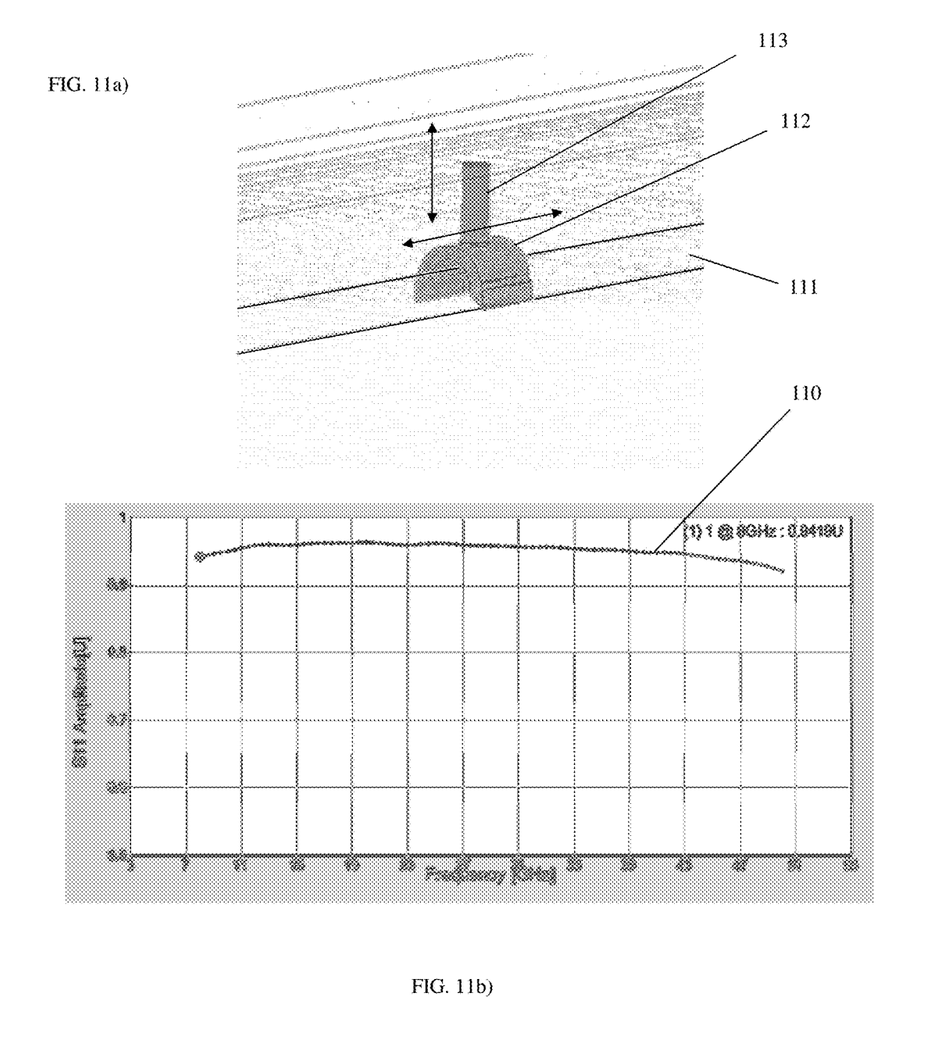
Figure 12:
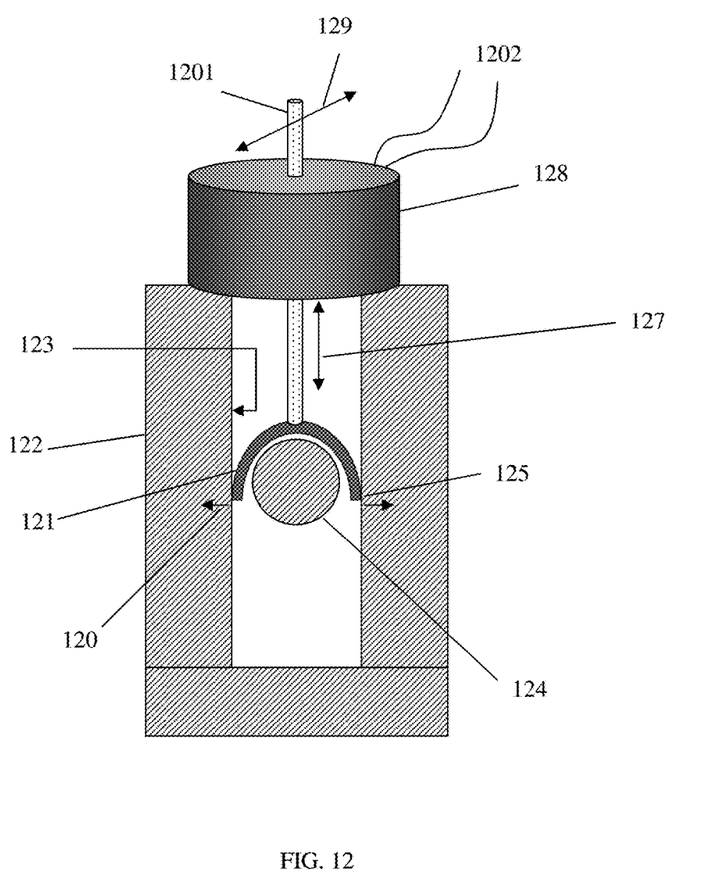
FIG. 12 depicts a variance of the new probe in an easier to manufacture form (no edge treatment).

This invention discloses new tuning probes for electromechanical and manual slide screw impedance tuners. The basic form of the new probes and their typical cross-section are shown in FIGS. 6, 7, 11a), 12, 13 and 15b). A thorough analysis of the electric field distribution in the slabline around the center conductor leads to the conclusion that the massive body of the prior art tuning probes (slugs) has no vital effect on the reflected energy. It would therefore be logical to eliminate it, if there would be another advantage; and there is:

Manufacturing prior art structures (FIG. 5) is tedious, both, in the case of slugs with spring effect to make galvanic ground contact (FIG. 5a) and in the case of solid slugs with capacitive ground contact (FIG. 5b). In the case of FIG. 5a) the hole (52) must be placed very carefully in the center of the slug in order to achieve the right symmetrical pressure and similar (identical if possible) spring effect (51) of the galvanic contact (50) on both sidewalls. Equally the exact width of the slot (58) is critical and must be kept small to avoid resonances which may appear (item (95) in FIG. 9). In the case of solid slugs, having capacitive ground contact, the manufacturing requirements have been discussed before: extreme precision in all dimensions, slugs and slabline uniformity and surface treatment must fit perfectly, in order to establish smooth slug travel along the whole horizontal and vertical travel of the slug inside the slabline to keep the capacitance constant; and to avoid the risk of "rubbing off" the extremely thin insulation layer between slug and slabline wall, which is necessary to reach sufficient capacitance (and low grounding resistance).

The new tuning probes have the approximate form of a half tube or axially cut cylinder (FIGS. 6, 7, 11a) and 12). Typically the probe periphery extends beyond half the cylinder, in order to reach beyond the center of the center conductor and capture a maximum of the electric field (134), (130) when the tube is closest to the center conductor (131); the electric field is concentrated between the center conductor (131) and the grounded slabline sidewalls (133), FIG. 13b). Maximum reflection is created when the distance between the probe (132) and the center conductor (131) is at a minimum, whereby the maximum deformation and capture of the electric field (134) occurs.

Figure 14:
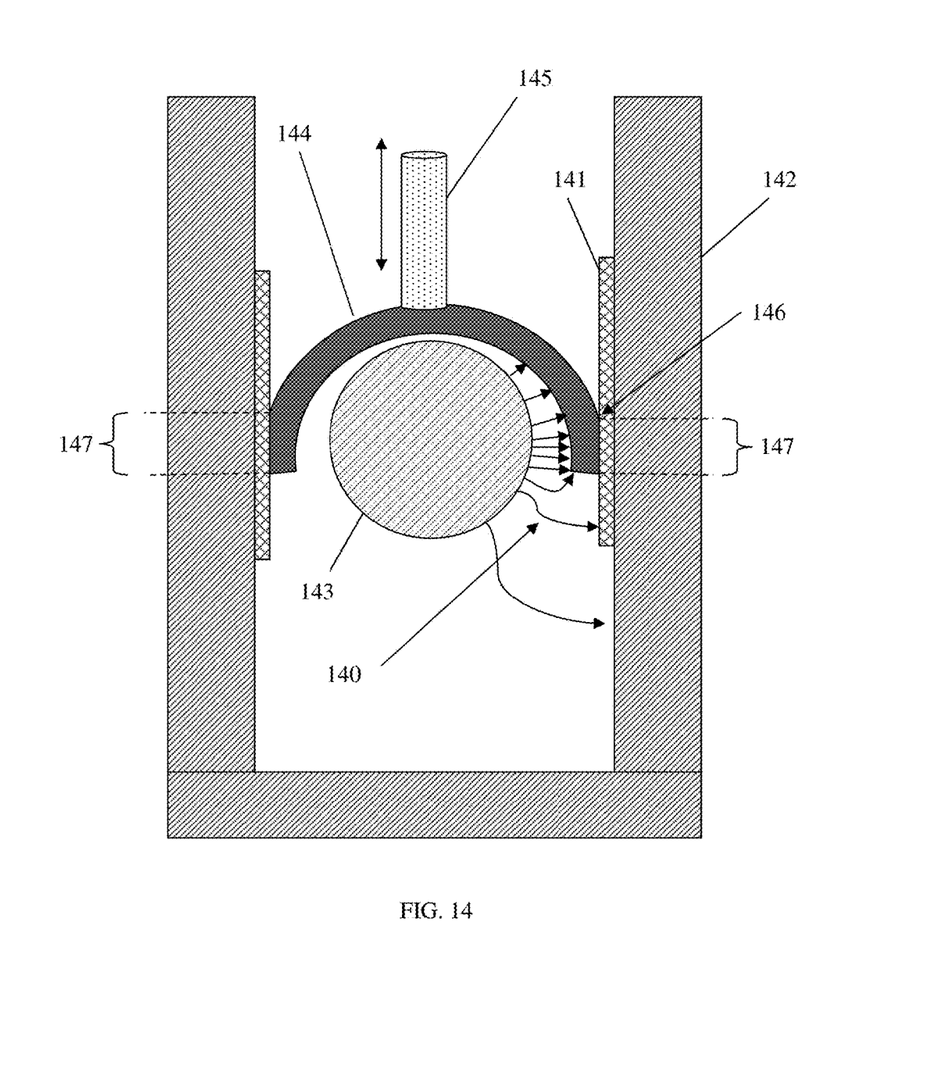
FIG. 14 depicts the electric field distribution in a slabline in the area of the tuning probe having capacitive ground contact.

Ground contact of the probe with the slabline walls can be galvanic (FIG. 13) or capacitive (FIG. 14); in the case of capacitive contact the probe edge (144) slides vertically and horizontally flat (146) on a thin dielectric layer (141), which is deposited on the sidewall (142) of the slabline. The electric field is still concentrated in the area (140) between the center conductor (143) and the sidewall (142); the field distribution is symmetrical to the center of the slabline (left side not shown in FIG. 14); it is important that the contact area (147) is large enough for creating the capacitance needed to be considered a RF short circuit: using the relation $|Z|=1/(2\pi*C*freq)$ one can estimate that, at 5 GHz the capacitance needed for a ground resistance to be 5 Ohm is $C \approx 6.3$ pF; using the relation $C=\epsilon o * \epsilon r * A/s$, whereby A is the contact area, s is the thickness of the dielectric layer (coating) and $\epsilon r$ its dielectric constant, $\epsilon o=8.854$ pF/m and assuming $\epsilon r=4$ for some Teflon or other plastic material having a thickness of 0.00005 m (50 µm), we obtain a required surface contact area $A=8.9$ mm² This is a realistic number to achieve, assuming the probe being 10 mm long, the contact height (147) should be less than 1 mm Considering also that the probe makes contact on both sidewalls simultaneously, creating two parallel resistances, such dimensions would generate a total grounding resistance of half the size, i.e. 2.5 Ohms The relations shown here are applicable in general, so various alternatives can be considered.

Figure 8:
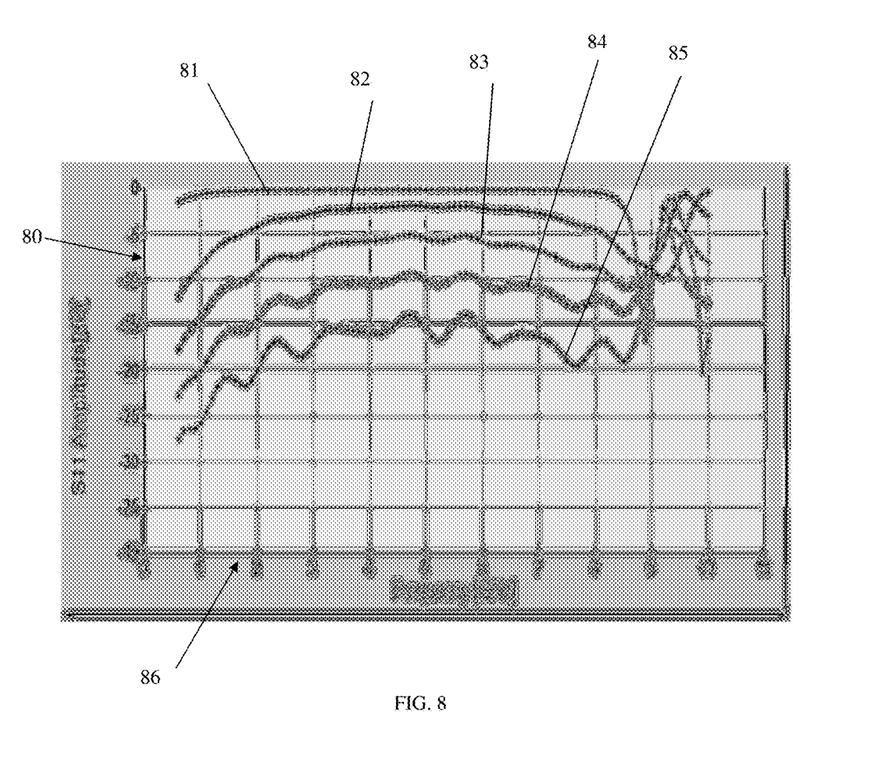
FIG. 8 depicts frequency response of the reflection factor (S11) of the new probe inside a slabline for a number of vertical positions (gap sizes between probe and center conductor).

The thickness of the tube material (132) is easily controlled: for low frequency (long) probes (FIGS. 7 and 8) the material will be thinner than in (short) high frequency probes (FIG. 11) in order to control the elasticity of the tube and by that the pressure (120) of the probe wings on the slabline sidewall (125). Numerical simulation using HSFSS (see ref. 6) shows the new probes (FIGS. 6, 7, 11a and 12) to have the same or better tuning capability (maximum reflection factor response or "tuning range") as prior art cubical (block) probes (FIGS. 8, 9 and 11b) see ref. 5. FIG. 8 shows the wideband reflection factor response of the new probes as a function of penetration into the slabline (distance between probe bottom and center conductor); traces (82, 83, 84, 85) correspond to the frequency response at large gaps. When the probe is completely withdrawn the electric field is not disturbed and the tuner behaves as a matched transmission line. Trace (81) is at maximum penetration (smallest gap between probe and center conductor); the smallest gap allowed, before electrical discharge, depends, obviously, on the applied RF power and DC voltage through the tuner. The electric field shall not exceed the discharge (Corona) value in air (approximately 4V/µm, see ref. 4).

Figure 15A:
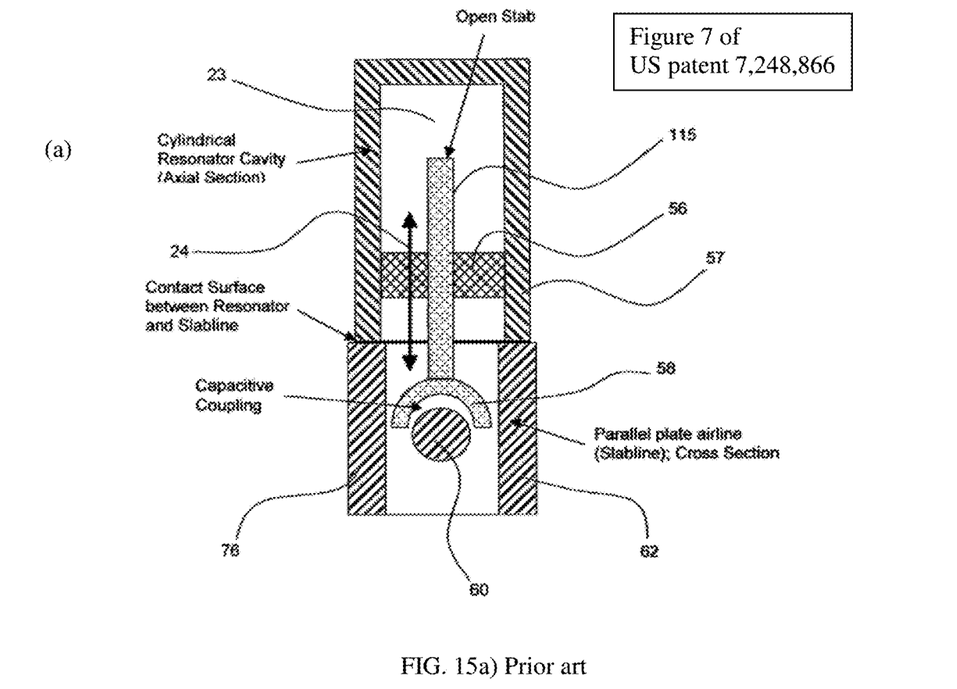
FIG. 15a) through 15b): 15a) depicts partly prior art: the tuning probes of frequency selective tuner (U.S. Pat. No. 7,248,866) and 15b) depicts the new probes.
Figure 15B:
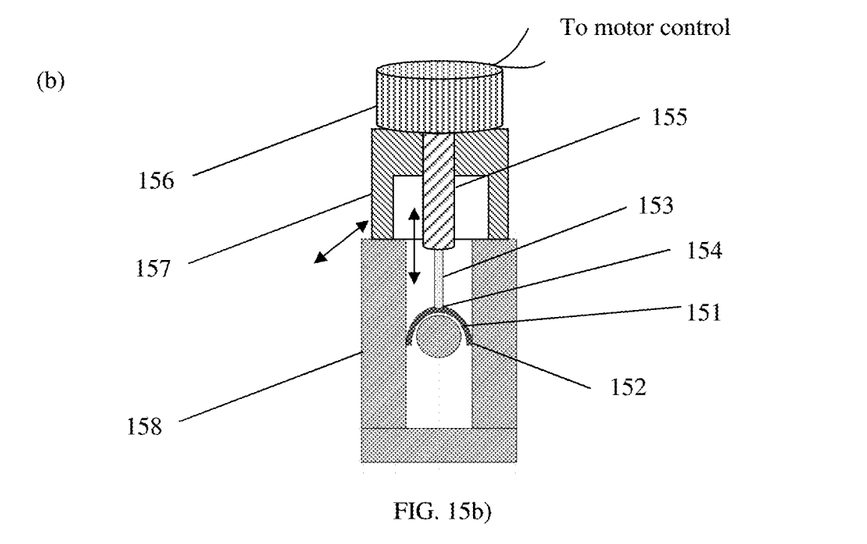

Depending on the application the stabs holding the probes (67) can be dielectric (non-conductive) in order to avoid resonances, or metallic. In a previous patent (see ref. 7) resonant tuning probes were disclosed (FIG. 15 a). The difference to the new probes (FIG. 15 b) is that in those resonant probes the tubular body was floating and did not have ground contact with the sidewalls of the slabline, neither galvanic nor capacitive; the holding stab is conductive, since the entire function of the probe relies on the series resonance created between the stab's (115 in FIG. 15a) inductive behavior and the capacitance between the floating probe body (58 in FIG. 15b); whereas in the present invention the probe body (151 in FIG. 15b) is grounded (152).

In FIG. 15 the structure of the carriage (157), which slides horizontally on the slabline (158) is shown. The vertical motor (156) holds the vertical axis (155) which holds the holding stab (153) of the tuning probe (151). Horizontal carriage control is as in prior art (motor, gear (27) and lead-screw (29) in FIG. 2). If the stabs (153) are conductive then, depending of the RF termination on their end which is not attached to the probe, they may create an RF short circuit at a given frequency at the probe contact (154): if the (conductive) stab (153) is open (i.e. insulated electrically from the vertical axis) and has an electrical length of λ/4 or it is shorted (i.e. electrically connected to the grounded vertical axis) and has a length of λ/2, in both cases it will create an RF short at the top of the probe (154). At frequencies in-between, a conductive stab will create some capacitive or inductive load at the top of the probe, which, in combination with the capacitance between the probe and the center conductor, and, depending on the grounding method of the tube edges (152) (especially in the case of capacitive grounding (146)) it may create undesired and unpredictable resonances (see ref. 7).

In a manual tuner configuration (not shown) the vertical motor (156) and axis (155) are replaced by a micrometer screw and horizontal movement is either by pushing the sliding carriage (157) by hand along the slabline (158), or by replacing the horizontal motor (27) by a rotating knob and using the same lead-screw (29), or by replacing the horizontal gear (27), (29) completely by a second micrometer screw. This would be more practical for high frequency tuners, where horizontal travel is short.

Beyond simpler manufacturability a further, practical advantage of the new probe structure is low sensitivity to vibrations: tuners are moved and shipped. During transportation they are subject to shocks and sudden accelerations/decelerations; the massive prior art probes will vibrate because they have a higher mass and will apply lateral force on the vertical axis, which supports them; this may even damage the vertical axis on which they are mounted. The new probes are less sensitive to shocks, and apply less stress on the vertical axis, because they have much lower mass.

Figure 10:
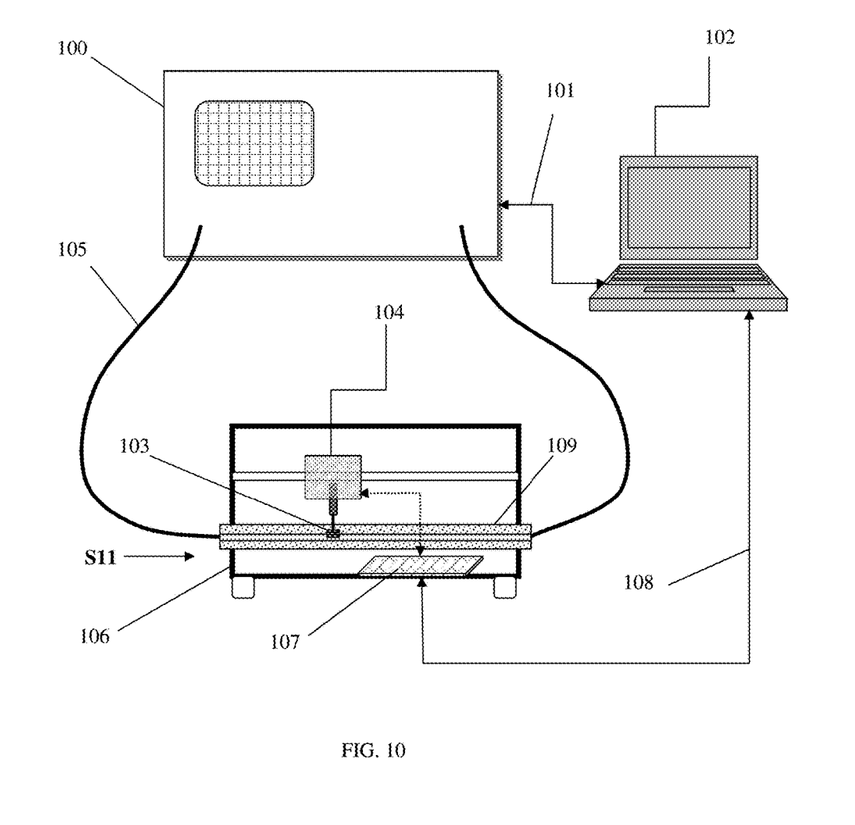
FIG. 10 depicts a setup for calibrating a tuner, which uses the new probes.

Tuner calibration at a selected frequency F comprises a number of steps, whereby the probe(s) (103) are placed at various vertical and horizontal positions inside the slot of the slabline (109) and the s-parameters are measured between the tuner ports using a pre-calibrated network analyzer (100) and saved, the total being controlled remotely (108) by a system computer (102). Each probe (103) is scaled, i.e. moved from a high (withdrawn) initial position into the slabline (109) towards the center conductor, to generate a number of reflection factor levels, which, depending on the application and resolution required, may vary from 5 to 20, from a minimum (residual reflection S11.min or GAMMA.min) value to a maximum S11.max (as required by the application): residual S11.min values are typically around 0.05 or less and maximum values S11.max depend on probe size and frequency and can reach S11.max>0.95; the ratio S11.max/S11.min is the tuning range of the probe. The measured reflection factor (S11) is associated with the corresponding vertical position of the probe and saved. In the case of multiple probes in the same carriage (this configuration is used in the case when each probe covers a different frequency range, see ref. 9, FIG. 2(b), items (High frequency probe) and (Low frequency probe) and FIG. 17) the procedure is repeated for each probe. In the case of multiple independent carriages the s-parameters of the initialized tuner, i.e. when the probes are withdrawn and moved to horizontal initial position, are measured and saved as matrix [S0]. This matrix [S0] is used later to be de-embedded (multiply the invers of its equivalent transmission matrix (T-matrix) [T0]$^{-1}$ with the equivalent T-matrices of s-parameters) from s-parameters of all probes except for the probe closest to the test port. In that context s-parameters of a probe "N" means s-parameters of the whole tuner measured between the test and the idle port, with probe N moving and all other probes initialized. All s-parameters of all probes are saved and permutations of s-parameters for the individual probe positions are generated numerically and saved in calibration files.

During tuning operations the s-parameters are retrieved from calibration files in memory for given probe position(s) and are, either used as such, or used to calculate interpolated s-parameters and subsequently measure and associate the measured DUT data to the corresponding reflection factor, which is the essence of load/source pull (see ref. 1).

Obvious alternatives to the disclosed concept of low cost semi-cylindrical RF probes for slide screw tuners are imaginable but shall not impede on to the validity of the present invention.

What I claim as my invention is:

1. Wideband tuning probes for automated slide screw impedance tuners, said tuners comprising
   two ports,
   a slabline comprising a center conductor and two sidewalls between the ports,
   at least one mobile carriage sliding parallel to the axis of the slabline,
   said carriage comprising a vertical axis,
said probes comprising a semi-cylindrical metallic tube body and a vertical holding stub,
whereby
   the tube has approximately the same diameter as the center conductor,
   the axis of the tube is parallel to the center conductor,
   the holding stub is attached to the top surface of the tube and is mounted on the vertical axis,
and whereby the axial edges of the semi-cylindrical tube body make sliding galvanic ground contact with the sidewalls of the slabline.

2. Wideband tuning probes for automated slide screw impedance tuners, said tuners comprising
   two ports,
   a slabline comprising a center conductor and two sidewalls between the ports,
   at least one mobile carriage sliding parallel to the axis of the slabline,
   said carriage comprising a vertical axis,
said probes comprising a semi-cylindrical metallic tube body and a vertical holding stub, whereby
- the tube has approximately the same diameter as the center conductor,
- the axis of the tube is parallel to the center conductor,
- the holding stub is attached to the top surface of the tube and is mounted on the vertical axis, and whereby the axial edges of the semi-cylindrical tube body make capacitive ground contact with the sidewalls of said slabline.

3. Tuning probes as in claim 1 or 2, whereby the cylindrical tube extends beyond the center line of the center conductor.

\* \* \* \* \*